(12) United States Patent
Kim et al.

(10) Patent No.: US 8,476,152 B2
(45) Date of Patent: Jul. 2, 2013

(54) N-TYPE CARRIER ENHANCEMENT IN SEMICONDUCTORS

(75) Inventors: Jee Hwan Kim, White Plains, NY (US); Stephen W. Bedell, Wappingers Falls, NY (US); Siegfried Maurer, Stormville, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/436,850

(22) Filed: Mar. 31, 2012

(65) Prior Publication Data

US 2012/0190177 A1  Jul. 26, 2012

Related U.S. Application Data

(62) Division of application No. 12/420,258, filed on Apr. 8, 2009, now Pat. No. 8,178,430.

(51) Int. Cl.
*H01L 21/265* (2006.01)

(52) U.S. Cl.
USPC .... 438/514; 438/919; 117/936; 257/E21.335; 257/E21.336

(58) Field of Classification Search
USPC ... 438/514, 517, 919; 117/936; 257/E21.335, 257/E21.336; 250/492.2, 492.21; 427/523
See application file for complete search history.

(56) References Cited

U.S. PATENT DOCUMENTS

| | | | |
|---|---|---|---|
| 3,207,635 A | 9/1965 | Baron | 257/46 |
| 3,548,269 A | 12/1970 | MacDougall | 257/469 |
| 3,655,457 A | 4/1972 | Duffy | 438/322 |
| 3,796,929 A | 3/1974 | Nicholas | 257/536 |
| 4,169,740 A | 10/1979 | Kalbitzer | 438/527 |
| 4,415,916 A | 11/1983 | Protic | 257/430 |
| 4,889,819 A | 12/1989 | Davari | 438/527 |
| 5,436,176 A | 7/1995 | Shimizu | 438/526 |
| 5,907,168 A | 5/1999 | Childs | 257/256 |
| 6,319,798 B1 | 11/2001 | Yu | 438/527 |
| 6,455,385 B1 | 9/2002 | Alvis | 438/301 |
| 6,627,522 B2 | 9/2003 | Sadigh | 438/510 |
| 6,680,243 B1 | 1/2004 | Kamath | 438/526 |
| 6,709,961 B2 | 3/2004 | Noda | 438/549 |
| 6,797,593 B2 | 9/2004 | Chakravarthi | 438/514 |
| 6,821,859 B2 | 11/2004 | Raebiger | 438/303 |
| 7,091,114 B2 | 8/2006 | Ito | 438/527 |
| 7,179,329 B2 | 2/2007 | Boone | 117/2 |
| 7,262,105 B2 | 8/2007 | Jawarani | 438/301 |
| 7,345,355 B2 | 3/2008 | Jain | 257/607 |
| 7,482,255 B2 | 1/2009 | Graoui | 438/528 |
| 7,700,450 B2 | 4/2010 | Lee | 438/301 |
| 7,825,016 B2 | 11/2010 | Giles | 438/528 |

(Continued)

OTHER PUBLICATIONS

J. Adey et al, Phys. Stat. Sol. 2, 6, 1953 (2005).

(Continued)

*Primary Examiner* — Mary Wilczewski
(74) *Attorney, Agent, or Firm* — George Sai-Halasz; Louis J. Percello

(57) ABSTRACT

A method includes epitaxially growing a germanium (Ge) layer onto a Ge substrate and incorporating a compensating species with a compensating atomic radius into the Ge layer. The method includes implanting an n-type dopant species with a dopant atomic radius into the Ge layer. The method includes selecting the n-type dopant species and the compensating species in such manner that the size of the Ge atomic radius is inbetween the n-type dopant atomic radius and the compensating atomic radius.

3 Claims, 6 Drawing Sheets

U.S. PATENT DOCUMENTS

| | | | |
|---|---|---|---|
| 7,825,493 B2 | 11/2010 | Ikeda | 257/616 |
| 2001/0041432 A1 | 11/2001 | Lee | 438/530 |
| 2002/0123195 A1 | 9/2002 | Frisina | 438/268 |
| 2005/0042848 A1 | 2/2005 | Jain | 438/530 |
| 2006/0148215 A1 | 7/2006 | Zhu | 438/482 |
| 2006/0160338 A1 | 7/2006 | Graoui | 438/527 |
| 2007/0018270 A1 | 1/2007 | Leon | 257/458 |
| 2008/0108208 A1 | 5/2008 | Arevalo | 438/514 |
| 2008/0299750 A1 | 12/2008 | Spencer | 438/530 |
| 2010/0035421 A1 | 2/2010 | Denison | 438/514 |
| 2010/0084583 A1 | 4/2010 | Hatem | 250/492.21 |
| 2010/0261319 A1 | 10/2010 | Kim | 438/142 |

OTHER PUBLICATIONS

V.P. Markevich et al, Phys. Rev. B, 70, 235213 (2004).

J.-P. Fleurial, et al, "Status of the improved n-type SiGe/GaP thermoelectric material", AIP Conference Proceedings, vol. 246, pp. 326-331, 1992, ISSN: 0094-243X.

N-TYPE CARRIER ENHANCEMENT IN SEMICONDUCTORS

CROSS REFERENCE TO RELATED APPLICATIONS

This application is a Divisional of application Ser. No. 12/420,258, filed Apr. 8, 2009, which is incorporated herein by reference in its entirety.

This application is also related to application Ser. No. 13/357,656 filed Jan. 25, 2012, incorporated herein by reference in its entirety. Application Ser. No. 13/357,656 filed Jan. 25, 2012 is a Divisional application of application Ser. No. 12/420,258, filed Apr. 8, 2009.

FIELD OF THE INVENTION

The present invention relates to microelectronics. In particular, it relates to forming regions of high n-type carrier concentration in semiconductors, especially in germanium.

BACKGROUND OF THE INVENTION

Today's integrated circuits include a vast number of devices. Smaller devices and shrinking ground rules are the key to enhance performance and to reduce cost. As FET (Field-Effect-Transistor) devices are being scaled down, the technology becomes more complex, and changes in device structures and new materials are needed for maintaining the expected device performance improvements.

Germanium (Ge) is a strong candidate as a material to replace Si for advanced FET devices. It has significantly higher hole and electron mobilities than Si. Fabricating a Ge NFET, however, is challenging because of the low attainable n-type carrier concentration in the source and drain.

SUMMARY OF THE INVENTION

A method includes epitaxially growing a germanium (Ge) layer onto a Ge substrate and incorporating a compensating species with a compensating atomic radius into the Ge layer. The method includes implanting an n-type dopant species with a dopant atomic radius into the Ge layer. The method includes selecting the n-type dopant species and the compensating species in such manner that the size of the Ge atomic radius is inbetween the n-type dopant atomic radius and the compensating atomic radius.

BRIEF DESCRIPTION OF THE DRAWINGS

These and other features of the present invention will become apparent from the accompanying detailed description and drawings, wherein.

DETAILED DESCRIPTION OF THE INVENTION

Figure 1A:
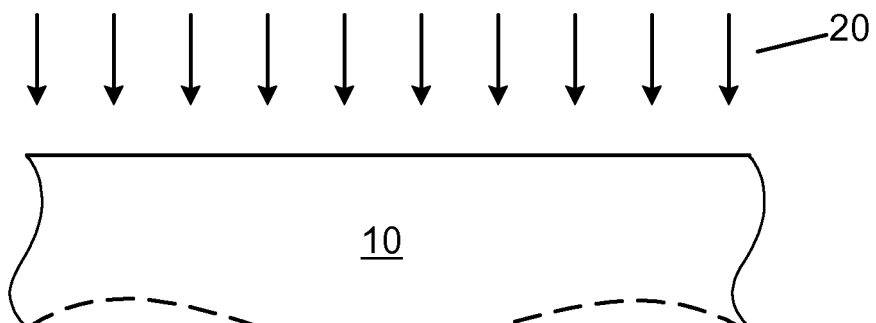
FIG. 1A-1C schematically show processes for enhancing n-type carrier concentration in a semiconductor, according to an embodiment of the invention.

Germanium (Ge), and silicon germanium (SiGe) with high Ge content, typically over 80%, are strong candidates for maintaining the progress in microelectronics. They may have significantly higher hole and electron mobilities than Si. Embodiments of the present invention enhance the concentration of n-type carrier in Ge and SiGe. The problems to overcome are the relatively low solid solubility limit (SSL) and the poor activation level of n-type dopants, such as phosphorus (P) and arsenic (As), in Ge and in high Ge content SiGe.

Table 1. shows atomic radius, SSL, and maximum activation level of various elements in Ge.

TABLE 1

|  | B ($r_B = 0.85$ Å) | P ($r_P = 1.1$ Å) | As ($r_{As} = 1.21$ Å) | Sb ($r_{Sb} = 1.41$ Å) |
|---|---|---|---|---|
| Atomic radius difference from Ge ($r_{Ge} - r_{dopant}$) | 0.34 | 0.12 | 0.01 | −0.19 |
| Equilibrium solubility in Ge | $5.5 \times 10^{18}$ | $2 \times 10^{20}$ | $7.3 \times 10^{19}$ | $1.2 \times 10^{19}$ |
| Activation level | $1.5 \times 10^{20}$ | $4 \times 10^{19}$–$5 \times 10^{19}$ | $2 \times 10^{19}$–$3 \times 10^{19}$ | $8 \times 10^{18}$ |

For ion-implanted boron (B), using $BF_2$ source as a p-type dopant in germanium, the maximum activation level of $1.5 \times 10^{20}$/cm$^3$ is two order of magnitude higher than the equilibrium solid solubility limit (SSL) of $5.5 \times 10^{18}$/cm$^3$. On the other hand, even if P is the most highly soluble donor in Ge among all group V elements, an ion implanted P layer shows poor activation in Ge. The maximum activation level of $5 \times 10^{19}$/cm$^3$ is significantly less than the equilibrium SSL of $2 \times 10^{20}$/cm$^3$.

The SSL and activation observations may be due to two reasons. First, Fermi-level change due to strain applied by substitutional dopants in a Ge lattice may play a role in changing the SSL of the doped layer. See for instance, J. Adey et al, Phys. Stat. Sol. 2, 6, 1953 (2005), incorporated herein by reference. Considering that substitutional B and P, having an atomic radius smaller than Ge, induce tensile strain in doped Ge layers on top of Ge substrates, changing acceptor and donor levels to opposite direction in a band gap by this tensile strain may result in enhancement in SSL of B and degradation in SSL of P. Furthermore, in Ge this SSL change due to the strain may be more pronounced than in Si, because Ge has smaller band gap than Si. Second, considering the fact that the point defects in Ge, such as vacancy-interstitial pairs, show acceptor-like behavior, residual implantation defects after thermal annealing may produce acceptor levels in the Ge band gap, see for instance, V. P. Markevich et al, Phys. Rev. B, 70, 235213 (2004), incorporated herein by reference. Therefore, ion-implanted p-type dopants may be more activated than the equilibrium SSL of these dopants. On the other hand, implantation-induced acceptor states may compensate activated donors, accordingly, activation level of n-type dopants may be smaller than the equilibrium SSL.

In order to enhance n-type dopant concentrations, embodiments of the present invention compensate the local strain due to dopants by introducing compensating species alongside the dopant species. Furthermore, to minimize damage from the implantation, which inhibit interstitial dopant from locating at substitutional site and may exhibit acceptor like behavior, embodiments of the present invention also use in-situ doping during epitaxial growth stage, and use multiple implantations of dopants with low doses and multiple anneals.

Figure 1B:
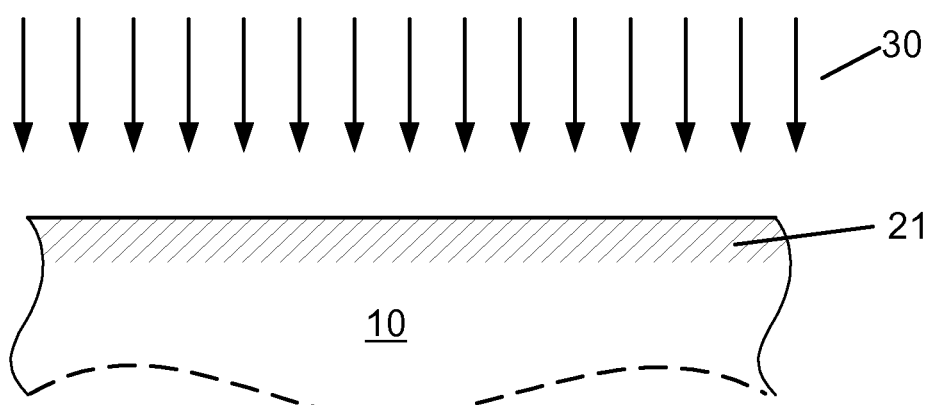
Figure 1C:
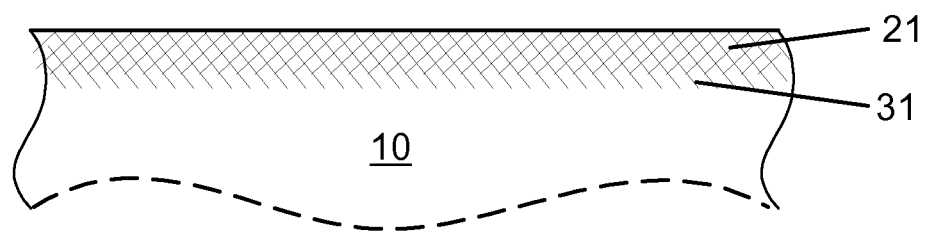

FIG. 1A-1C schematically show processes for enhancing n-type carrier concentration in a semiconductor, according to an embodiment of the invention. The figures depict a method for generating n-type carriers in a semiconductor 10, based on eliminating strain in the doped layer by compensating for the size difference between the dopant atom and the semiconductor atom.

The semiconductor 10 has a semiconductor atomic radius, such as, for instance, in the case of Ge the atomic radius is 0.122 nm. Even if the semiconductor would be an alloy, for instance SiGe, an atomic radius may be defined as the average atomic radius. Suppose a SiGe alloy is 90% Ge and 10% Si, the atomic radius would be 0.9×0.122 nm+0.1×0.111 nm=0.1209 nm; 0.111 being the Si atomic radius. The semiconductor 10 is not limited to Ge or SiGe, but may include many others, such as, without the intent of limiting, Si, III-V compounds, II-VI compounds, and further mixtures.

FIG. 1A depicts the implanting 20 of a compensating species 21 into the semiconductor 10. The compensating species 21 has a compensating atomic radius. FIG. 1B shows the implanting 30 of an n-type dopant species 31 into the semiconductor 10, which already contains the compensating species 21. The n-type dopant species 31 has a dopant atomic radius. FIG. 1C shows the semiconductor 10 having received both the dopant species 31 and the compensating species 21. In accordance with the presented embodiment of the invention of reducing strain, the n-type dopant species and the compensating species are selected in such a manner that the size of the semiconductor atomic radius is inbetween the dopant atomic radius and the compensating atomic radius. As a consequence of this selection, the top layer near the surface of the semiconductor 10, which has both implanted species 21, 31, is strain free, or at least has a reduced strain in comparison if only the dopant species 31 would be present in the semiconductor 10. If only the dopant species 31 would be present, there would be tensile strain, and if only the compensating species 21 would be present, there would be a compressive strain present. The two strains fully, or partially, cancel each other, resulting in a strain free, or nearly strain free state.

In a representative embodiment of the invention the semiconductor 10 may be selected to be Ge. Furthermore, the n-type dopant species 31 may be selected from the group of P, As, or their mixture. Typically the n-type dopant species 31 may be P. The compensating species 21 may be selected to be antimony (Sb). Of course, Sb itself is an n-type dopant. However, considering Sb's low SSL and activation in Ge, its role as dopant may be secondary to its role as compensating for the small atomic radius of P. Instead of Sb, one may chose a compensating species 21 that has no, or even acceptor, electrical role, but has an atomic radius of the right size. Thus, P may be pared up, for instance, with tin (Sn), or indium (In).

The implanting 30 of the n-type dopant species 31 and the implanting 20 of the compensating species 21 may be carried out in a preselected order of sequence. Depending on particulars, for instance, in a case of FET fabrication, the order of the two implantations 20, 30 may be selected according to the needs as they arise during processing. There may be no inherent reason to set a particular order for first implanting the dopant species 31 or the compensating species 21. There is a possibility, as well, that the implanting 30 of the n-type dopant species 31 and the implanting 20 of the compensating species 21 are carried out concurrently.

As it is well known in the art, thermal annealing, in general, is part of the activation of an implanted species and of the healing of implantation damage. However, the amount of defect healed by the annealing is limited, and implantation damage may prevent dopants from being activated. A complete healing of implantation damage may occur when such a small amount of dopant is implanted, which can be healed by a single annealing. For the embodiment depicted in FIG. 1A-1C, thermal annealing maybe performed in a variety of ways. Without limitation, thermal annealing may be done inbetween the preselected order of sequence of the implanting 30 of the n-type dopant species 31 and the implanting 20 of the compensating species 21. Thermal annealing may be carried out after both species have been implanted. Thermal treatment may also involve the heating of the semiconductor 10 while implanting is taking place. The semiconductor 10 may be heated during compensating species 21 implantation 20, during dopant species 31 implantation 30, or during both implantations 20, 30.

Thermal annealing has practically endless variations known to those skilled in the art. It is understood that the whole range of known techniques are available carrying out the methods of the present invention. Such techniques without limitation may be rapid annealing, furnace annealing, laser annealing, and others.

To enhance the previously available n-type dopant concentrations, the embodiment depicted in FIG. 1A-1C may be carried out in such a manner that the concentration of the n-type carriers exceeds the concentration previously attainable using P, $5 \times 10^{19}/cm^3$, by a predetermined amount. This desirable predetermined amount may be about $1 \times 10^{20}/cm^3$, for a total concentration of well in excess of $10^{20}/cm^3$.

The processes depicted in FIG. 1A-1C, namely the implantations and thermal anneals, may be followed through with repetitions, until the n-type carrier concentration is maximized, or reached the desired predetermined level.

Figure 2A:
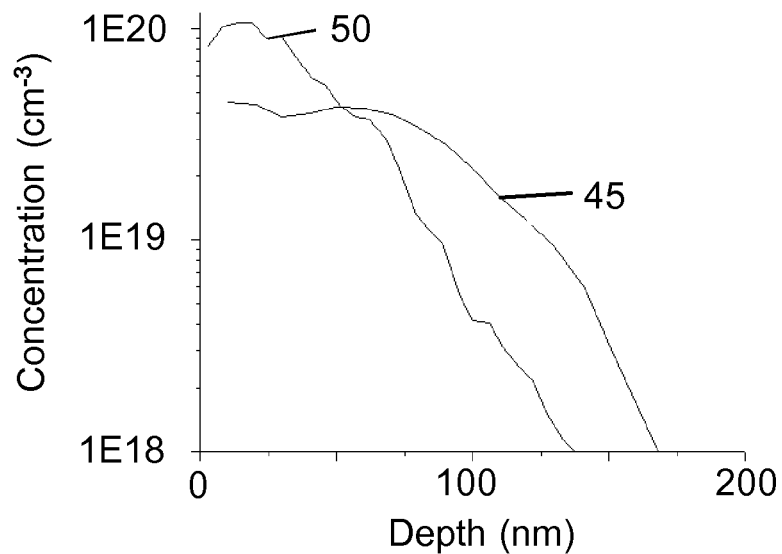
FIGS. 2A and 2B show experimental and simulation results of mobile carrier and dopant densities.
Figure 2B:
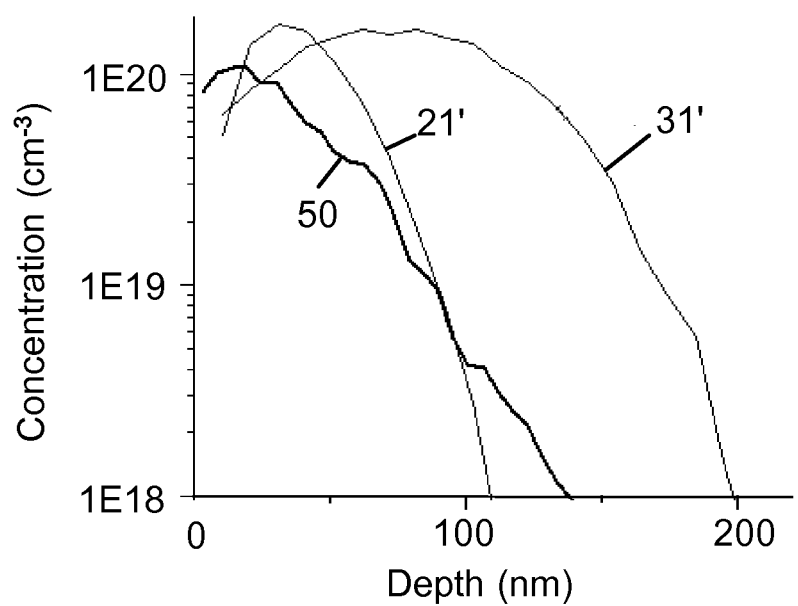

FIGS. 2A and 2B show experimental and simulation results of mobile carrier and dopant concentrations. FIG. 2A shows n-type active dopant concentrations as obtained by spreading resistance profile (SRP) measurements. The Ge substrate was implanted with $6 \times 10^{14}/cm^2$ of P at 90 keV, and with $6 \times 10^{14}/cm^2$ of Sb at 65 keV, and received 500° C. for 10 sec rapid thermal anneal. A control Ge substrate received identical treatment except that the Sb implantation was missing, consequently the implanted region was under tensile stress. The data of the control sample 45, shows the expected results of P in Ge. The n-type carrier concentration peeks around $4 \sim 5 \times 10^{19}/cm^3$. In contrast, the data of the experimental sample 50, with the Sb compensating species implanted, the n-type carrier concentration peeks around $1.5 \times 10^{20}/cm^3$.

This value exceed all previously reported n-type concentration levels, and it is about the same as it is done with p-type carriers using B implantation.

FIG. 2B shows the same SPR data 50, together with the concentrations of the implanted atoms, that of P 31' and that of Sb 21'. These latter were obtained using a secondary ion mass spectrometer (SIMS). When comparing the atomic concentration curves 21', 31' with the SRP curve, it can be seen that electrical activity takes place nearby the Sb implant. This may indicate that Sb controls the electrical activation of P.

Figure 3:
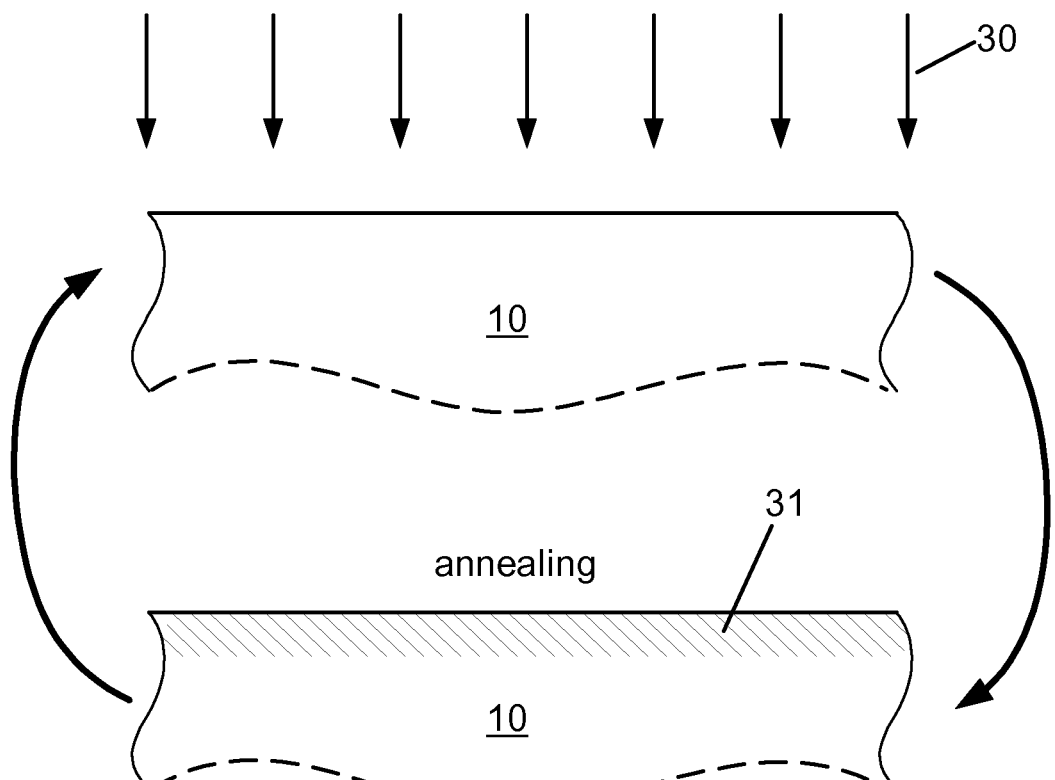
FIG. 3 schematically shows processes for enhancing n-type carrier concentration in a semiconductor, according to an alternate embodiment of the invention.

FIG. 3 schematically shows processes for enhancing n-type carrier concentration in a semiconductor, according to an alternate embodiment of the invention. The figure depicts a method for generating n-type carriers in a semiconductor 10, based on eliminating the implantation induced defects, which may behave as acceptor states.

In this alternate embodiment one may set a target concentration for the n-type carriers. A dose of an n-type dopant species 31 is implanted 30 into the Ge 10. The dose is selected to correspond to a fraction of the target concentration. In this manner the implanting 30 causes some damage in the Ge 10, but the damage is less than it would been if the full dose had been implanted. Next, a thermal annealing is carried out on the Ge in such manner to activate the n-type dopant species, and to repair a least a portion of the implant damage. These two steps, the fractional implanting and the annealing, are repeated until the target concentration has been reached. In a representative embodiment one could repeat these two step maybe 3 times, using each time ⅓ of the dose corresponding to the target concentration. The thermal annealing could follow procedures known in the art. In FIG. 3 the arrows on the two sides of the figure represent the sequence that may be followed for multiple implantations and multiple anneal. The fractional implantations followed by anneals, may minimize the implantation damage in Ge.

In this embodiment one may select, again, as the n-type dopant species 31 phosphorous P, and the target concentration to be between about $5 \times 10^{19}/cm^3$ and about $2 \times 10^{20}/cm^3$, which is above the concentration previously attainable using P in Ge.

Figure 4:
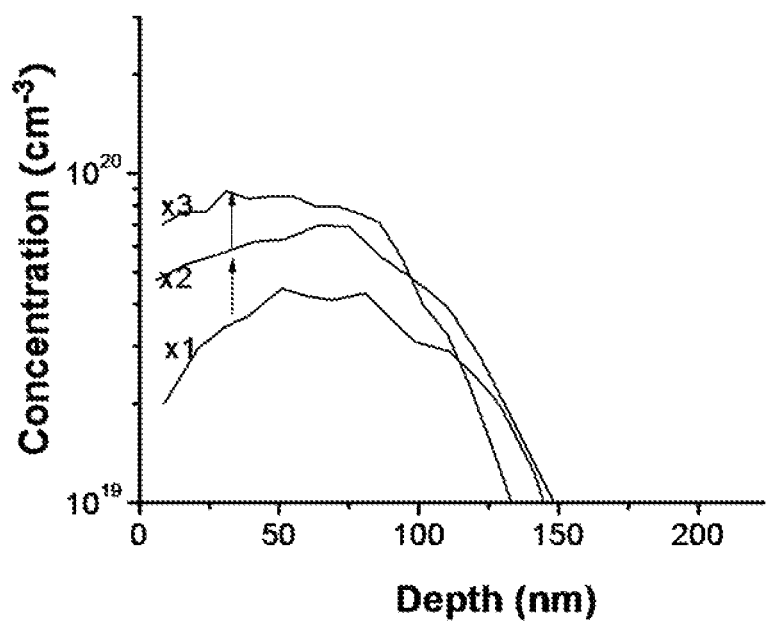
FIG. 4 shows experimental results of mobile carrier concentration.

FIG. 4 shows experimental results of mobile carrier concentration for a Ge sample with three implantations 30 of phosphorous 31, and three annealings. In each implantation, the dose equivalent to $5 \times 10^{19}/cm^3$ was implanted. The data was taken by SRP measurements. The data shows an increase in active carrier concentration of approximately of $2 \times 10^{19}/cm^3$ with each fractional implantation and annealing. The mobile carrier concentration after the third such cycle clearly exceeds the customarily limiting value of $5 \times 10^{19}/cm^3$.

Figure 5A:
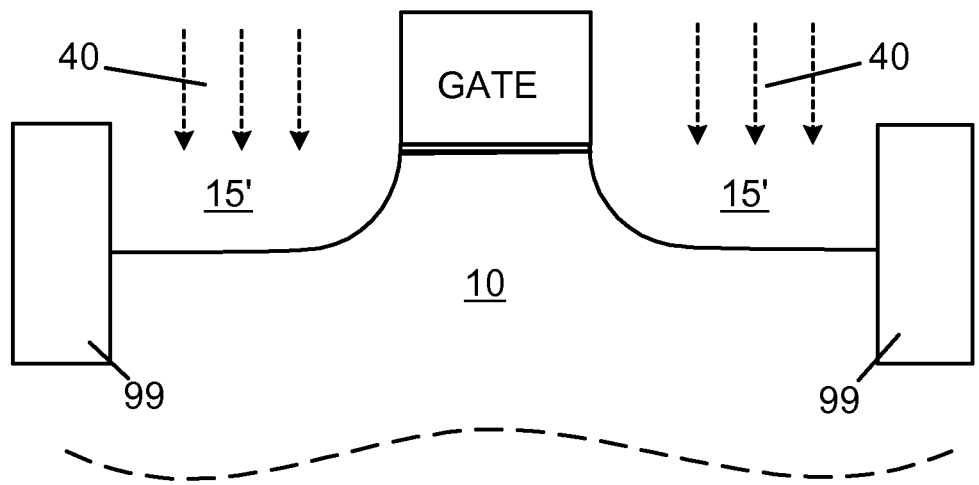
FIGS. 5A and 5B schematically show processes for enhancing n-type carrier concentration within the framework of FET processing, according to an embodiment of the invention.
Figure 5B:
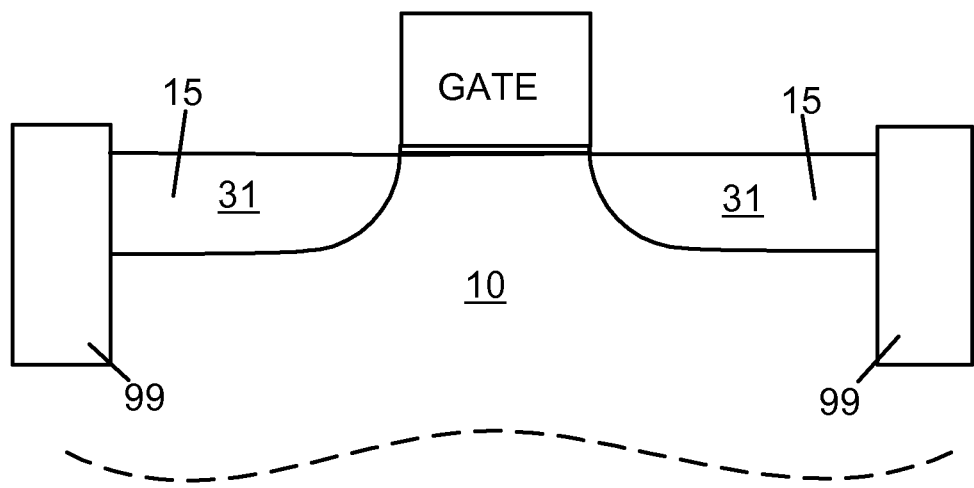

FIGS. 5A and 5B schematically show processes for enhancing n-type carrier concentration within the framework of FET processing, according to an embodiment of the invention and based on eliminating the implantation induced defects.

It is understood that Field Effect Transistor-s (FET) are well known in the electronic arts. Standard components of a FET are the source, the drain, the body in-between the source and the drain, and the gate. The gate is overlaying the body and is capable to induce a conducting channel in the body between the source and the drain. In the usual nomenclature, the channel is hosted by the body. The gate is typically separated from the body by the gate insulator. There are two types of FET devices: a hole conduction type, called PFET, and an electron conduction type, called NFET.

Manufacturing of FETs is very well established in the art. It is understood that there are a large number of steps involved in such processing, and each step might have practically endless variations known to those skilled in the art. It is further understood only those process steps will be detailed here that are of interest in embodiments of the present invention.

FIG. 5A shows a state in the FET processing. The channel region, beneath the gate, is hosted in Ge 10. The figure shows what typically may be only a small fraction of an electronic chip, for instance a processor, as indicated by the wavy dashed line boundary. The schematic representation of the figure implies no real size relationships between the various depicted elements.

The source and drain 15 are being formed by selective epitaxy 40 of Ge, typically using chemical vapor deposition (CVD). Such depositions are well know in the art. One way of forming source and drain by Ge epitaxy, without limitation, is to etch pockets into the source and drain locations 15', which are adjoining the channel region and the device isolations 99, and which will be filled by the epitaxial 40 deposition of the Ge.

During the forming of the source and drain 15 by Ge epitaxy 40, an n-type dopant species 31, typically P, may be incorporated into the deposited Ge. Such incorporations of various elements during epitaxy are well known in the art. The n-type dopant species is supplied in sufficient quantity to attain a high n-type carrier concentration in the source and drain 15, as it is needed for a high performance NFET.

According to the embodiment depicted on FIGS. 5A and 5B the source and drain 15 are formed without implantation, in a, so called, in-situ manner. Since there is no implantation, acceptor like defects may not be created, and all incorporated n-type dopants 31, typically P, would be activated, preferably into the $10^{20}/cm^3$ range.

A variation on this embodiment would incorporate into the epitaxially 40 deposited Ge not only an n-type dopant species, but a compensating species as well.

Figure 6A:
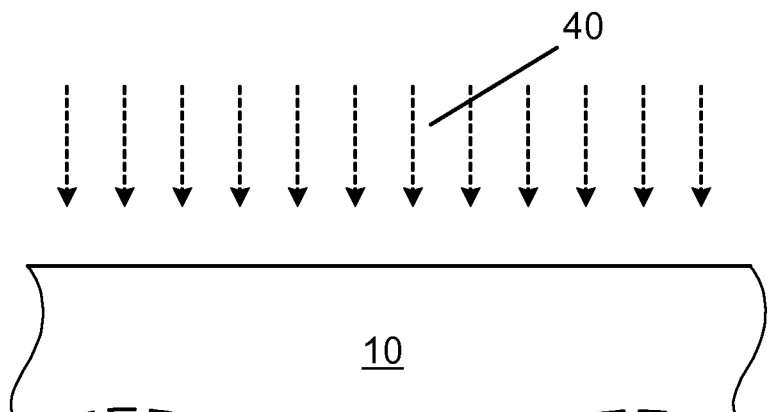
FIG. 6A-6C schematically show processes for enhancing n-type carrier concentration in a semiconductor, according to a further embodiment of the invention.
Figure 6B:
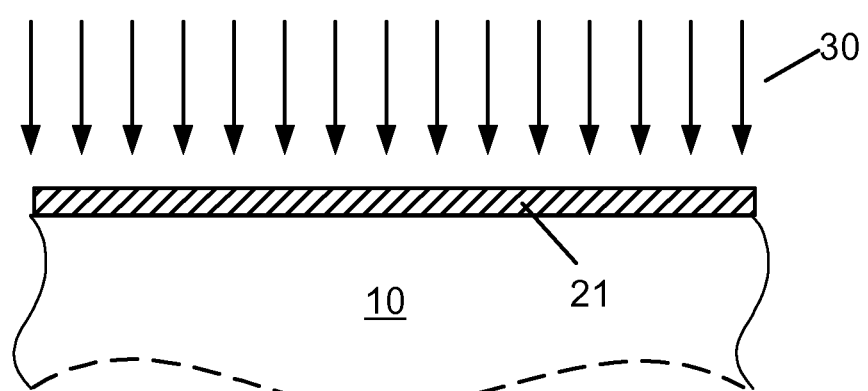
Figure 6C:
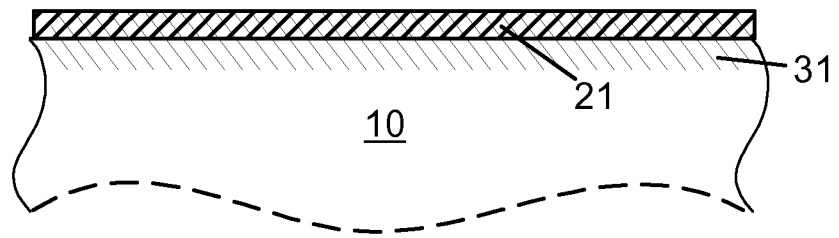

FIG. 6A-6C schematically show processes for enhancing n-type carrier concentration in a semiconductor, according to a further embodiment of the invention; based on eliminating strain in the doped layer by compensating for the size difference between the dopant atom and the semiconductor atom, and furthermore, by minimizing implant damage.

FIG. 6A shows a Ge substrate 10, having a Ge atomic radius. Onto the substrate 10 a Ge layer is being epitaxially 40 grown, by known methods in the art, typically by CVD. During the Ge epitaxy 40, a compensating species 21 may be incorporated into the deposited Ge. The compensating species has a compensating atomic radius. FIG. 6B shows the Ge substrate 10 and the epitaxially deposited Ge layer containing the compensation species 21. Accordingly, the compensation species is in place without having incurred implantation damage. Next, one may implant 30 an n-type dopant species 31 into the Ge layer. The n-type dopant species has a dopant atomic radius. One may select the n-type dopant species 31 and the compensating species 21 in such a manner that the size of the Ge atomic radius is inbetween the dopant atomic radius and the compensating atomic radius.

FIG. 6C illustrates that as a consequence of this selection the top layer near the surface of the Ge substrate 10 is strain free, or at least has reduced strain in comparison if only the dopant species 31 would be present. Thermal annealing would follow the implantation of the n-type dopant species. The implant damage prior to the annealing, however, is already reduced since only one of the two species has been implanted. The implantation of the n-type dopant species 31 may have been performed in such manner that the n-type dopant species 31 reached beyond the epitaxial layer and penetrated into the Ge substrate 10.

The n-type dopant species 31 may be selected from the group of P, As, or their mixture. Typically the n-type dopant species 31 may be P. The compensating species 21 may be selected to be Sb. As it was observed, and previously discussed, Sb may be controlling the activation of P. Accordingly, an ultra-thin epitaxial layer of Ge with Sb compensation species 21 should be sufficient for achieving the desired high n-type carrier concentration, and at the same time to attain very shallow junctions, which are known to have advantages in FET fabrication.

In the same manner as with the embodiment depicted on FIGS. 1A-1C, this embodiment, shown in FIGS. 6A-6C, may be carried out in such manner that the concentration of the n-type carriers exceeds $5 \times 10^{19}/cm^3$ by a predetermined amount. This desirable predetermined amount may be about $1 \times 10^{20}/cm^3$, for a total concentration well in excess of $10^{20}/cm^3$.

Figure 7A:
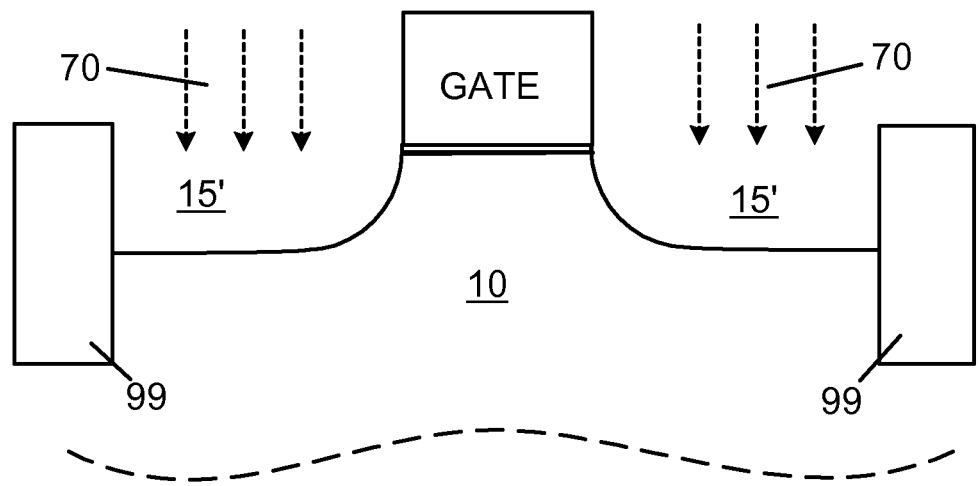
FIGS. 7A and 7B schematically show processes for high performance FET fabrication, according to an embodiment of the invention.
Figure 7B:
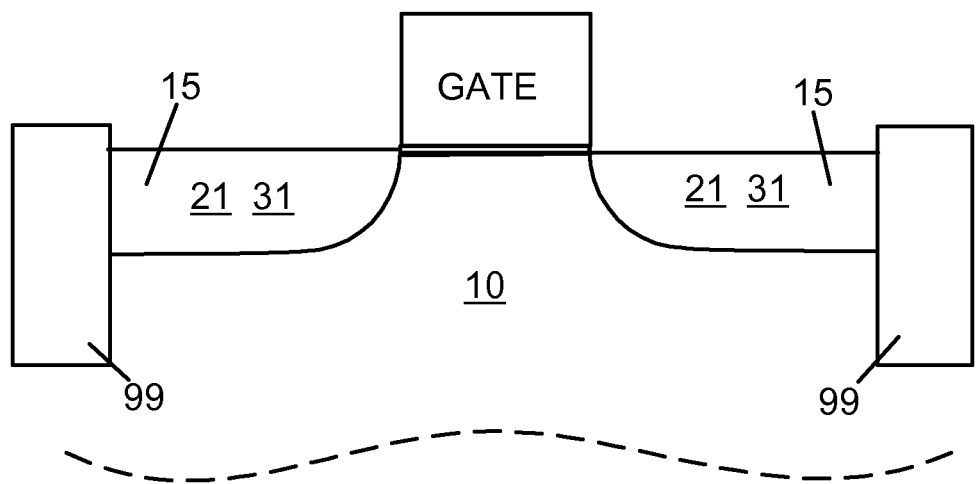

FIGS. 7A and 7B schematically show processes for high performance FET fabrication, according to an embodiment of the invention; based on eliminating strain in the source and drain junctions by compensating for the size difference between the dopant atom and the semiconductor body atom, and furthermore by fully avoiding implant damage.

FIG. 7A shows a state in the FET processing. The channel region, beneath the gate, is hosted in Ge 10. The figure shows what typically may be only a small fraction of an electronic chip, for instance a processor, as indicated by the wavy dashed line boundary. The schematic representation of the figure implies no real size relationships between the various depicted elements. Devices may be isolated from one another by structures known in the art, such as by shallow trenches 99. Such shallow trenches 99 are illustrated in the figures, as they are a typical advanced isolation technique available in the electronics processing art, but their presence is not necessary for embodiments of the present invention.

FIGS. 7A and 7B also shows the forming a source and a drain 15 for the FET using selective epitaxy 70 of SiGe. The composition of the SiGe is so chosen to cause a tensile strain of a desired extent for the channel region. The SiGe has a SiGe atomic radius. Such source and drain epitaxy is known in the art and it is typically done using chemical vapor deposition (CVD). One embodiment for forming source and drain by SiGe epitaxy 70, without limitation, would be to etch pockets into the source and drain locations 15', which are adjoining the channel region, and which will be filled by the epitaxial 70 deposition of the SiGe.

During the epitaxial forming 70 of the source and drain 15, an n-type dopant species 31 and a compensating species 21 are incorporated into the SiGe. Such incorporations of various elements during epitaxy is well known in the art. The n-type dopant species 31 has a dopant atomic radius and the compensating species 21 has a compensating atomic radius. One may select the n-type dopant species 31 and the compensating species 21 in such a manner that the size of the SiGe atomic radius is inbetween the dopant atomic radius and the compensating atomic radius.

FIG. 7B illustrates, that as a consequence of this selection the source and drain 15, that have both the n-dopant species 31 and the compensation species 21, are strain free, or at least have reduced strain in comparison if only the n-dopant species 31 would be present in the source and drain 15. Furthermore, no implantation has taken place, therefore there are a priori no acceptor like implantations defect to contend with. What may make this Ge NFET of exceptionally high performance, is that the source and drain 15, formed by SiGe instead of Ge, causes tensile strain in the adjacent channel region, thus, as it is known in the art, greatly increases n-type carrier mobility. Such high carrier mobility, coupled with enhanced n-type carrier concentration in the source and drain 15 as per the depicted embodiment of FIGS. 7A and 7B, may lead to the desired high performance FET.

The n-type dopant species 31 may be selected from the group of P, As, or their mixture. Typically the n-type dopant species 31 may be P. The compensating species 21 may be selected to be Sb.

In the same manner as with the embodiment depicted on FIGS. 1A-1C, this embodiment shown in FIGS. 7A and 7B may be carried out in such manner that the concentration of the n-type carriers exceeds $5 \times 10^{19}/cm^3$ by a predetermined amount.

Since future down-scaling in Si microelectronic industry requires higher dopant concentration, the same principle of the current invention can be used for Si technology as a strategy for enhancing the solid solubility of the dopants in Si. For example, $B^+$ doping with In compensation can be used to increase $p^+$ activation level in SiGe source and drain for strained Si PFET technology.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under", "over", "top", "adjacent", "on", etc., as used herein refer to relative location and orientation of various portions of the structures with respect to one another, and are not intended to suggest that any particular absolute orientation with respect to external objects is necessary or required.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Many modifications and variations of the present invention are possible in light of the above teachings, and could be apparent for those skilled in the art. The scope of the invention is defined by the appended claims.

The invention claimed is:

1. A method for generating n-type carriers in germanium (Ge), comprising:
   supplying a Ge substrate, wherein said Ge substrate has a Ge atomic radius;
   epitaxially growing a Ge layer onto said Ge substrate and incorporating a compensating species into said Ge layer during said epitaxial growth, wherein said compensating species has a compensating atomic radius;
   implanting phosphorous (P) into said Ge layer, wherein said P has a dopant atomic radius;
   selecting said compensating species in such manner that the size of said Ge atomic radius is inbetween said dopant atomic radius and said compensating atomic radius; and selecting a dose for said P in such manner that a concentration of said n-type carriers in said Ge layer exceeds 70% of the equilibrium solubility of P in Ge.

2. The method of claim 1, wherein said method further comprises performing said implanting in such manner that said n-type dopant species penetrates into said Ge substrate.

3. The method of claim 1, wherein said method further comprises selecting said compensating species to be antimony (Sb).

* * * * *